(12) United States Patent
Mollon et al.

(10) Patent No.: US 8,577,171 B1
(45) Date of Patent: Nov. 5, 2013

(54) METHOD FOR NORMALIZING MULTI-GAIN IMAGES

(75) Inventors: William Mollon, Tracy, CA (US); Tom Sha, San Leandro, CA (US)

(73) Assignee: Gatan, Inc., Warrendale, PA (US)

( * ) Notice: Subject to any disclaimer, the term of this patent is extended or adjusted under 35 U.S.C. 154(b) by 1076 days.

(21) Appl. No.: 11/831,452

(22) Filed: Jul. 31, 2007

Related U.S. Application Data

(60) Provisional application No. 60/820,820, filed on Jul. 31, 2006.

(51) Int. Cl.
*G06K 9/40* (2006.01)

(52) U.S. Cl.
USPC ............ 382/275; 382/141; 250/310; 250/311

(58) Field of Classification Search
USPC .................................................. 382/274–275
See application file for complete search history.

(56) References Cited

U.S. PATENT DOCUMENTS

| | | | | |
|---|---|---|---|---|
| 5,212,546 A * | 5/1993 | Arazi et al. | .................... | 358/518 |
| 5,694,481 A * | 12/1997 | Lam et al. | ..................... | 382/145 |
| 5,715,326 A * | 2/1998 | Ortyn et al. | .................... | 382/128 |
| 5,740,267 A * | 4/1998 | Echerer et al. | ................ | 382/132 |
| 5,761,336 A * | 6/1998 | Xu et al. | ........................ | 382/141 |
| 5,777,327 A * | 7/1998 | Mizuno | .......................... | 250/310 |
| 6,081,577 A * | 6/2000 | Webber | .......................... | 378/23 |
| 6,091,845 A * | 7/2000 | Pierrat et al. | .................... | 382/144 |
| 6,141,439 A * | 10/2000 | Yoshida et al. | ............... | 382/154 |
| 6,222,935 B1 * | 4/2001 | Okamoto | ...................... | 382/149 |
| 6,654,493 B1 * | 11/2003 | Hilliard et al. | ................ | 382/167 |
| 6,656,120 B2 * | 12/2003 | Lee et al. | ...................... | 600/437 |
| 6,875,984 B2 * | 4/2005 | Kakibayashi et al. | ......... | 250/311 |
| 7,110,597 B2 * | 9/2006 | Goldsmith | ................... | 382/167 |
| 7,151,258 B2 * | 12/2006 | Kochi et al. | .................... | 250/310 |
| 7,233,434 B2 * | 6/2007 | Shribak | .......................... | 359/371 |
| 7,394,999 B2 * | 7/2008 | Zaima | ............................. | 399/27 |
| 7,715,659 B2 * | 5/2010 | Zhao et al. | ..................... | 382/305 |
| 7,751,643 B2 * | 7/2010 | Zavadsky et al. | .............. | 382/274 |
| 2001/0008418 A1 * | 7/2001 | Yamanaka et al. | ............. | 348/222 |
| 2002/0054112 A1 * | 5/2002 | Hasegawa et al. | ............. | 345/764 |
| 2002/0057428 A1 * | 5/2002 | Nakayama et al. | ......... | 356/239.2 |
| 2003/0076989 A1 * | 4/2003 | Maayah et al. | ................ | 382/145 |
| 2003/0104288 A1 * | 6/2003 | Pang | .................................. | 430/5 |
| 2003/0136907 A1 * | 7/2003 | Takane et al. | .................. | 250/310 |
| 2003/0174215 A1 * | 9/2003 | Goldsmith | ................. | 348/222.1 |
| 2004/0022429 A1 * | 2/2004 | Suzuki et al. | .................. | 382/145 |
| 2004/0108459 A1 * | 6/2004 | Furukawa et al. | ............. | 250/311 |

(Continued)

FOREIGN PATENT DOCUMENTS

| | | | | | |
|---|---|---|---|---|---|
| DE | | 19746331 A1 | * | 4/1999 | ................ G03F 7/20 |
| JP | | 2006121695 A | * | 5/2006 | |

*Primary Examiner* — Gandhi Thirugnanam
(74) *Attorney, Agent, or Firm* — Caesar, Rivise, Bernstein, Cohen & Pokotilow, Ltd.

(57) ABSTRACT

A method for correcting an image made from a system having a plurality of settings wherein the system has optical artifacts which vary according to the settings. The method includes acquiring one reference image of a substantially uniform subject with the system at a first setting. Acquiring a second reference image of the uniform subject with the system at a second setting. Storing both reference images and correcting a subject image acquired by the system by using either the first reference image or the second reference image, depending on the setting at which the subject image was acquired. The method is capable of acquiring and storing multiple reference images and storing them with assignment to multiple settings.

9 Claims, 9 Drawing Sheets

(56) References Cited

U.S. PATENT DOCUMENTS

| | | |
|---|---|---|
| 2004/0135083 A1* | 7/2004 | Kakibayashi et al. ........ 250/307 |
| 2004/0146615 A1* | 7/2004 | McDonald et al. ........... 426/231 |
| 2004/0208385 A1* | 10/2004 | Jiang ............................ 382/254 |
| 2004/0218804 A1* | 11/2004 | Affleck et al. ................ 382/141 |
| 2004/0234144 A1* | 11/2004 | Sugimoto et al. ............ 382/239 |
| 2005/0061972 A1* | 3/2005 | Kochi et al. .................. 250/310 |
| 2005/0094170 A1* | 5/2005 | Ichitani ........................ 358/1.9 |
| 2005/0236648 A1* | 10/2005 | Nishiyama et al. ........... 257/200 |
| 2006/0210135 A1* | 9/2006 | Kanegae ....................... 382/132 |
| 2006/0289757 A1* | 12/2006 | Kochi et al. .................. 250/310 |
| 2007/0071357 A1* | 3/2007 | Rahn et al. ................... 382/275 |
| 2007/0080973 A1* | 4/2007 | Stauder et al. ............... 345/589 |
| 2007/0145270 A1* | 6/2007 | Miyamoto et al. ............ 250/310 |
| 2007/0201739 A1* | 8/2007 | Nakagaki et al. ............. 382/149 |
| 2007/0230768 A1* | 10/2007 | Adler et al. ................... 382/144 |
| 2007/0238954 A1* | 10/2007 | White et al. .................. 600/407 |
| 2008/0049219 A1* | 2/2008 | Kim et al. .................... 356/237.4 |
| 2008/0075385 A1* | 3/2008 | David et al. .................. 382/275 |
| 2008/0304752 A1* | 12/2008 | Matteoni et al. ............. 382/209 |
| 2008/0317379 A1* | 12/2008 | Steinberg et al. ............. 382/275 |
| 2009/0080799 A1* | 3/2009 | Mooney ....................... 382/275 |
| 2009/0097735 A1* | 4/2009 | Sasajima ....................... 382/141 |
| 2009/0136121 A1* | 5/2009 | Nakagaki et al. ............. 382/149 |
| 2009/0154764 A1* | 6/2009 | Khan et al. ................... 382/100 |
| 2010/0039520 A1* | 2/2010 | Nanu et al. ................... 348/222.1 |
| 2010/0067809 A1* | 3/2010 | Kawata et al. ................ 382/224 |
| 2011/0112401 A1* | 5/2011 | Watanaba ..................... 600/443 |
| 2011/0255770 A1* | 10/2011 | Touya et al. .................. 382/144 |

* cited by examiner

METHOD FOR NORMALIZING MULTI-GAIN IMAGES

CROSS-REFERENCE TO RELATED APPLICATIONS

This utility application claims the benefit under 35 U.S.C. §119(e) of Provisional Application Ser. No. 60/820,820 filed on Jul. 31, 2006 entitled DIGITAL MICROGRAPH MULTI-GAIN IMAGING, the entire disclosure of which is incorporated by reference herein.

FIELD OF THE INVENTION

This invention relates to the field of digital camera image correction. More specifically, this invention relates to automated correction of image flaws due to imaging system aberrations.

BACKGROUND OF THE INVENTION

As no optical imaging system can ever be perfect, improvements are desirable that can correct or minimize the effect of imperfections on the resulting images. One way to improve the images produced by an optical system is to characterize the optical flaws and artifacts and correct the resulting images based on this information. One way to do this is image normalization. Image normalization is a process whereby a reference image is made of what is usually a uniform surface or other subject suitable as a reference. The reference image is made under conditions that exhibits any optical artifacts of the system. For example, a black and white CCD camera may have individual or groups of inoperative/defective pixels. These would show up as black or white spots in a reference image taken of a uniform surface. Because these artifacts are constant, they will appear in any image taken with that particular device. A normalized image can then be created by using the collected reference image, which, when properly combined, "normalizes" the flawed pixels so that they appear to have the same value as all of the remaining pixels of the image of the uniformly illuminated subject. Obviously, this technique cannot reproduce the value the flawed pixel should have been had it operated properly. However, the overall effect of the flawed pixel on the image quality is, on average, reduced, if the value is normalized instead of being left as full black or white. For example, if pixels can have values of 1 to 100, and a flawed pixel is normalized to 50, the most the pixel can be off from the true value is 50, whereas if the pixel is stuck at 1 or 100, the pixel could be off as far as 99. One skilled in the art will recognize that more sophisticated normalization methods exist for correcting images as light values are not linear, and, for example, artificial intelligence means can be employed to "normalize" known flawed areas to the values of surrounding areas, instead of to a fixed value.

In the field of electron microscopy, examples of "fixed flaws" include, detector irregularities (pixel non-uniformity and fixed pattern contrast from the scintillator), dust and scratches on the scintillator surface. These flaws produce artifacts in the raw unprocessed image that can be manifested as dark shadows, excessively bright highlights, specks and mottles that alter the true pixel value data.

Normalization of images to correct for optical artifacts requires that the flaws and their effect on the image is fixed. If the reference image appears different each time it is taken, it is not possible to prepare a corrective image to normalize subsequent images.

One optical artifact that cannot be normalized with a single reference image is that of unequal illumination to the CCD sensor. For example, in a Transmission Electron Microscope (TEM), depending on where the imaging device is physically placed on the microscope's column, illumination of the device can be markedly brighter at the center than at the edges. If this effect is constant for all images, then it can be normalized. However, where certain operating parameters (accelerating voltage, magnification, probe size, beam intensity, etc.) of the TEM are adjustable, the effect of unequal illumination is not constant for all microscope settings. Thus, while a normalization image may be able to correct for fixed flaws, such as bad pixels, a single reference image is incapable of compensating for the effect of unequal illumination where that effect is not constant at different microscope settings (e.g., magnification or accelerating voltage). Thus, a need exists for an image normalization method that can normalize optical artifacts in a system where the artifacts vary depending on microscope parameters or other system settings.

SUMMARY OF THE INVENTION

In an exemplary embodiment, there is provided a method for correcting an image made from a system having a plurality of settings wherein the system produces image artifacts which vary according to the settings. The method includes the steps of: acquiring a first reference image of a substantially uniform subject with the system set to a first setting, storing the first reference image, acquiring a second reference image with the system set to a second setting, storing the second reference image, and then correcting an image of a specimen acquired by the system by using either the first or second reference image to normalize the image of the specimen. The first reference image is used to normalize the specimen image if the specimen image was made with a system setting similar to that at which the first reference image was made. The second reference image is used to normalize the specimen image if the specimen image was made with a system setting similar to that at which the second reference image was made.

According to another aspect of the invention, there is provided a method for correcting an image acquired in a system having a system parameter that can be adjusted to a plurality of settings where the system has optical artifacts. The effect on the acquired image of some of the optical artifacts can vary depending on the setting to which the system parameter is adjusted. The method includes the steps of: acquiring a first reference image of a substantially uniform subject with the system parameter adjusted to a first setting; storing the first reference image and associating it with a first range of system parameter settings; acquiring a second reference image of the substantially uniform subject with the system parameter adjusted to a second setting; storing the second reference image and associating the second reference image with a second range of system parameter settings. A subject image is then corrected using either the first or the second reference image depending on the system parameter setting at which said subject image was acquired. If the subject image was acquired at a system setting associated with the first reference image, then the first reference image is used to correct the subject image. If the subject image was acquired at a system setting associated with the second reference image, then the second reference image is used to correct the subject image.

Other advantages and novel features of the invention will become apparent to those skilled in the art upon examination of the following detailed description of a preferred embodiment of the invention and the accompanying drawings.

DESCRIPTION OF THE DRAWINGS

The foregoing summary, as well as the following detailed description of the invention, will be better understood when read in conjunction with the appended drawings. For the purpose of illustrating the invention, there are shown in the drawings certain embodiments which are presently preferred. It should be understood, however, that the invention is not limited to the precise arrangements and instrumentalities shown.

FIG. 8c. is an exemplary gain normalized image of the raw electron beam of FIG. 8a;

DESCRIPTION OF THE PREFERRED EMBODIMENT OF THE INVENTION

Without further elaboration, the foregoing will so fully illustrate this invention that others may, by applying current or future knowledge; readily adopt the same for use under various conditions of service.

Figure 1:
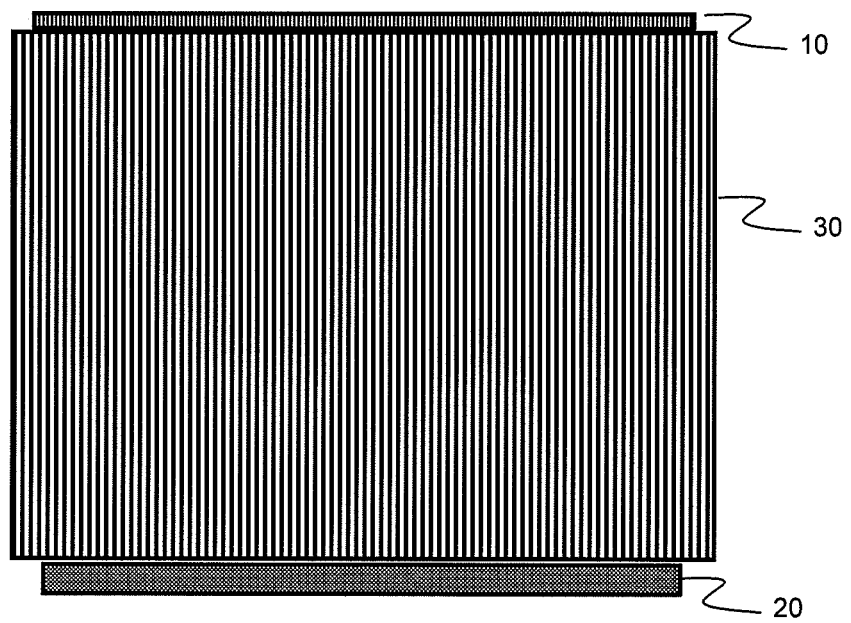
FIG. 1. shows an exemplary charged coupled device and scintillator for use in a TEM.
Figure 2:
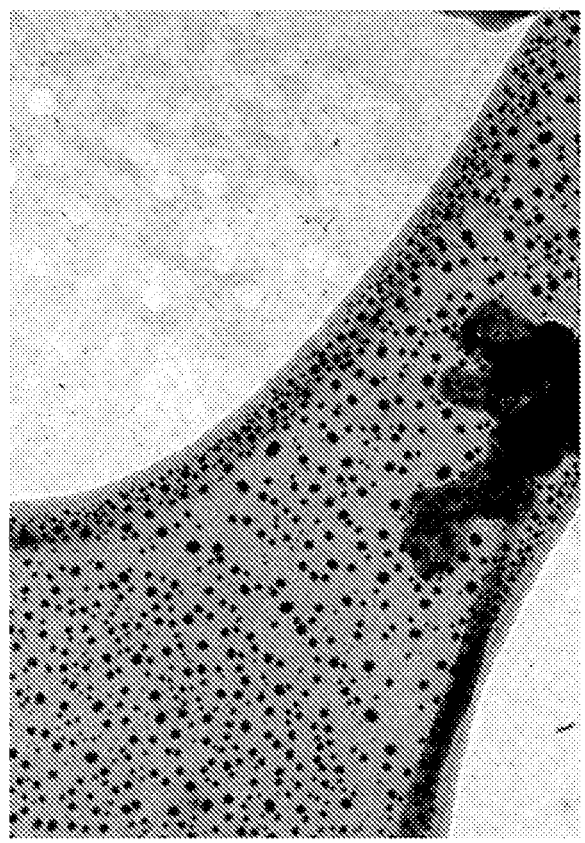
FIG. 2. is an exemplary image with evidence of optical artifacts.

FIG. 1, shows an exemplary charged coupled device (CCD) 10 and scintillator 20 for use in a TEM. The scintillator 10 converts high energy electrons to visible light, which is sensed by the CCD 20. In this exemplary design, the scintillator is optically coupled to the CCD by a fiber optic bundle 30. Various means of coupling a scintillator to a CCD are known in the art such as lens and fiber optics, but it will be recognized that any coupling can produce optical artifacts. FIG. 2 is an exemplary TEM image made with a CCD coupled to a scintillator by a fiber optic bundle. The hexagonal irregularities in the upper left corner of the image are artifacts from the fiber optic bundle coupling the scintillator to the CCD. Because this bundle is fixed between the two devices, it will have the same effect on every image made. Other examples of irregularities can be from defects, scratches and debris on the scintillator 10 surface. Thus, the artifacts from the coupling and other irregularities can be normalized with prior art methods.

Figure 3:
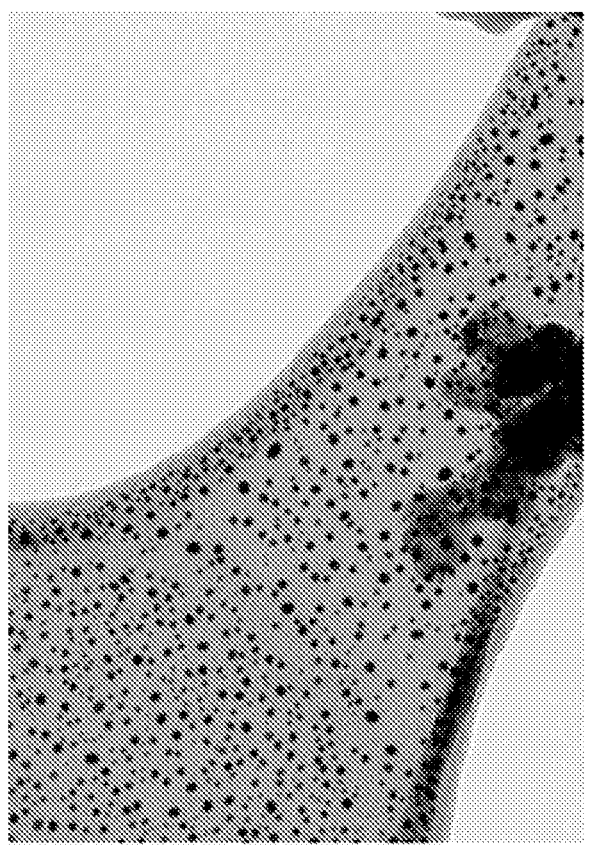
FIG. 3. is a normalized image of FIG. 2.

For example, a reference image of a uniform illuminated surface is made. The reference image will contain the fiber optic bundle artifacts of the kind seen in FIG. 2. A normalization image or data set is made from the reference image, so that when the normalization image is combined with the reference image, the resulting image is uniform and substantially free from artifacts. The normalization image is then combined with every image acquired by the device, to eliminate the artifacts. FIG. 3 shows the same image as FIG. 2, after normalization. Note that the upper left corner is substantially uniform and free from artifacts.

Figure 4:
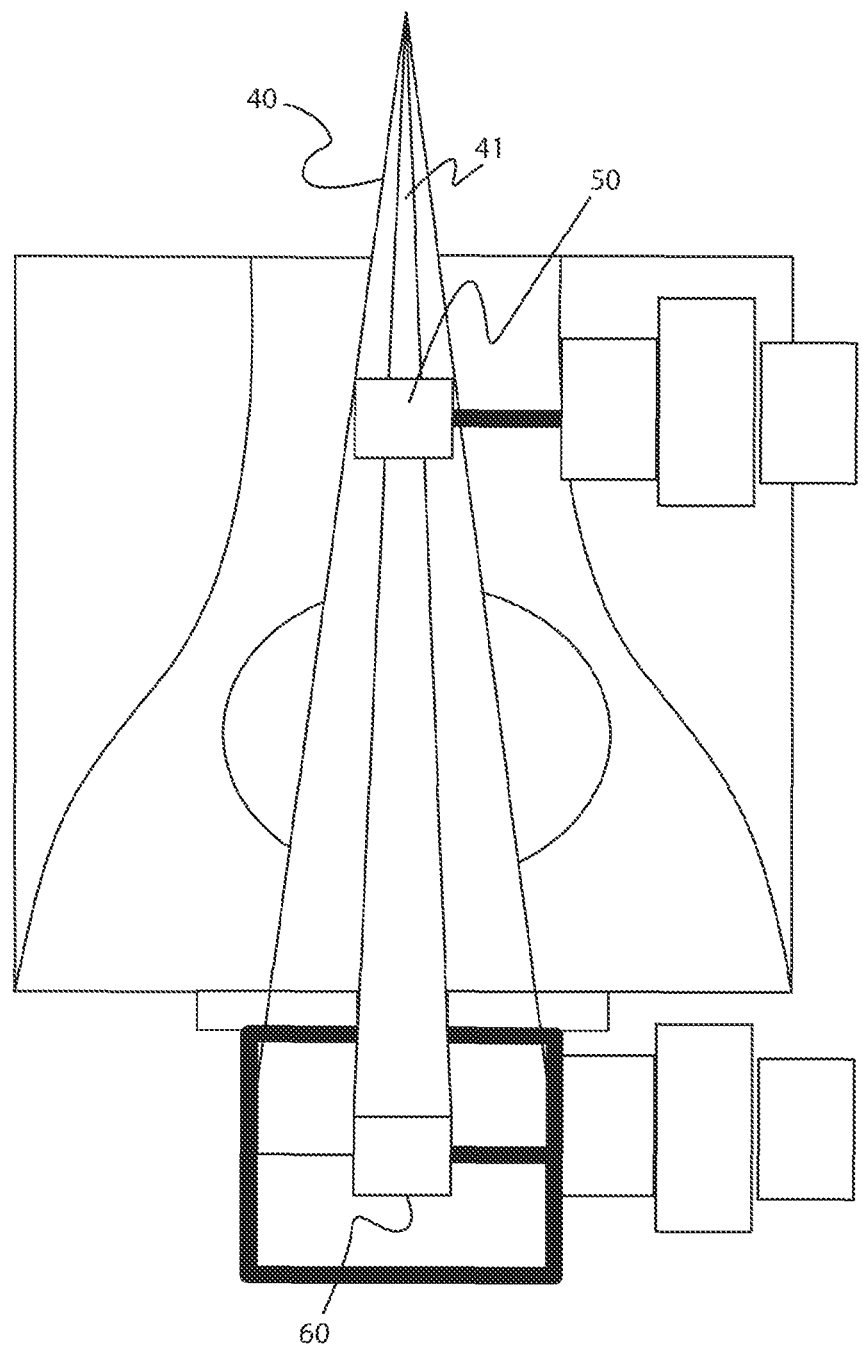
FIG. 4. is a schematic diagram of an exemplary Transmission Electron Microscope (TEM) at a first magnification setting.
Figure 5:
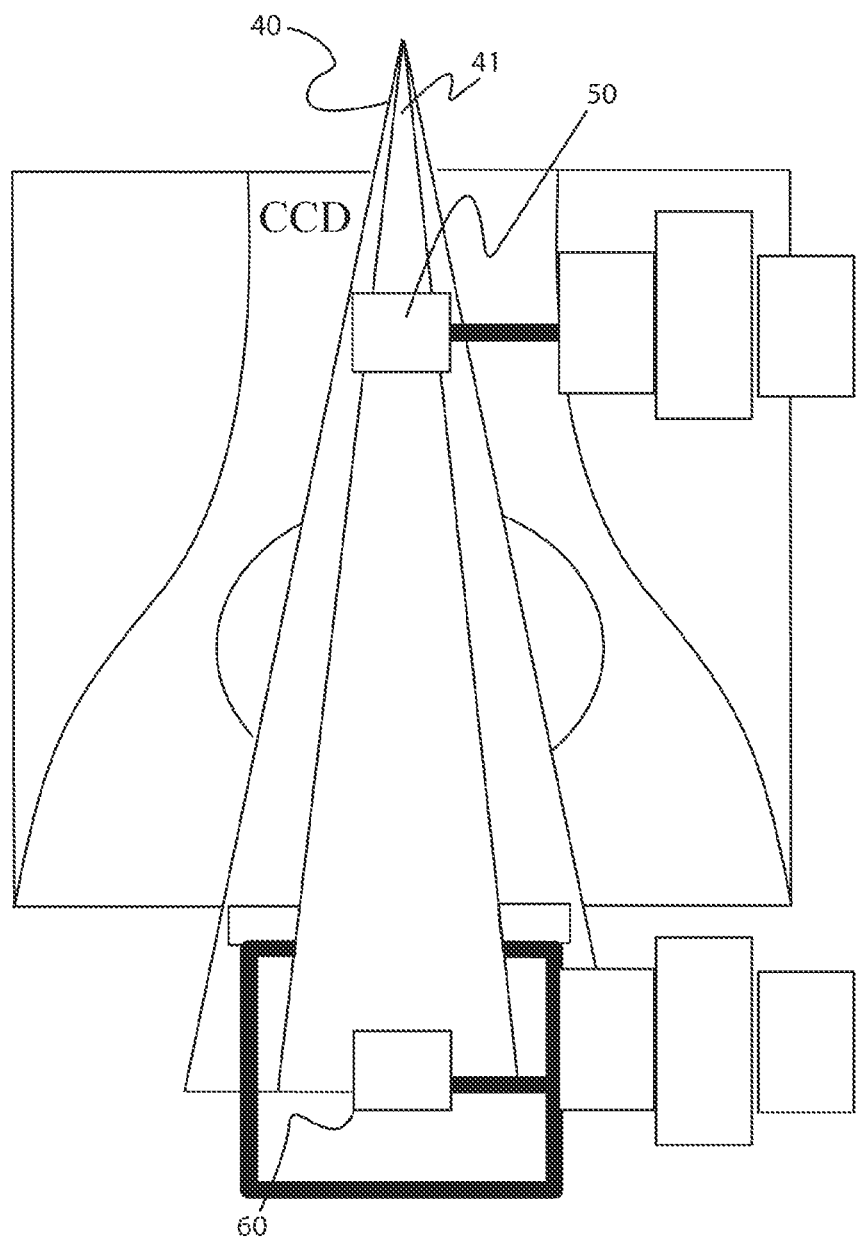
FIG. 5. is an is a schematic diagram of an exemplary TEM at a second magnification setting.
Figure 6:
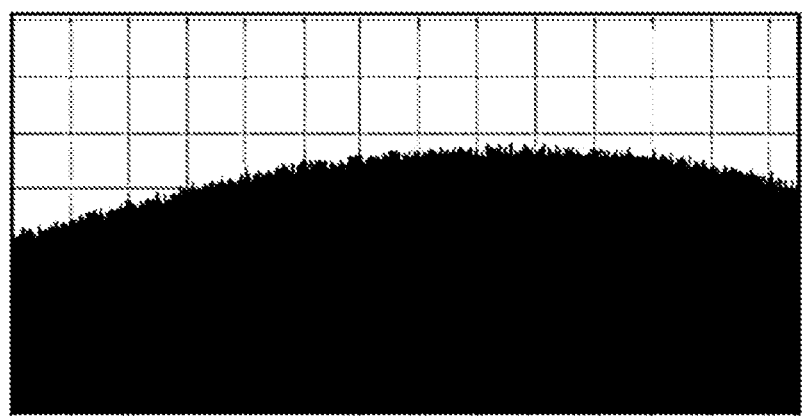
FIG. 6. is an exemplary line profile of image intensity from a TEM at a first magnification setting.
Figure 7:
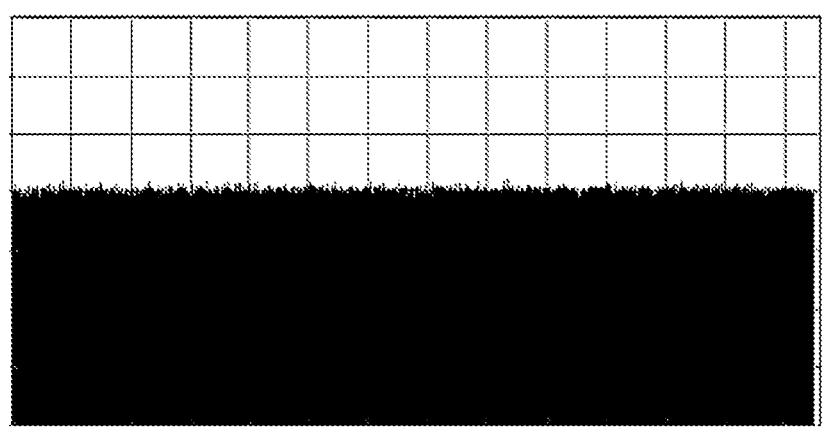
FIG. 7. is an exemplary line profile of image intensity from a TEM at a second magnification setting.

It is known in the art that the scintillator/CCD imaging device in a TEM receives an unequal amount of electron illumination across the surface area of the scintillator. This effect is more pronounced the closer the scintillator is to the electron beam source. FIG. 4 shows the lower section of a TEM, with electron beam 40 illuminating an upper level CCD 50 and a lower level CCD 60. In FIG. 4, it can be seen that the central portion 41 of the beam 40 completely covers the lower CCD 60, but that the central portion 41 of the beam 40 only partially covers the upper level CCD 50. Illumination intensity varies across the entire width of the beam 40, but in the upper level CCD, the full variation of the illumination intensity is distributed across the face of the CCD 50, whereas only a portion of the illumination variation is distributed across the face of the lower CCD 60. FIG. 5 shows how a change in the TEM operating parameters will affect this unequal illumination of the CCD. As the magnification setting of the TEM is increased, the angle of the beam 40 gets wider. Thus, the unequal illumination across the face of the scintillator will change with changes in TEM magnification setting. Where the scintillator/CCD is positioned close to the beam source, the effect of changing beam width on evenness of scintillator illumination will be the most pronounced, as less of the darker periphery of the beam will be imaged when the beam angle is expanded at greater magnifications. This effect is not as dramatic on the scintillator/CCD 60 that is mounted lower in the TEM because, there, the scintillator is receiving only a portion of the electron beam at all magnification levels. FIGS. 6 and 7 further illustrate the effect of CCD position on evenness of image illumination. FIG. 6 is a line profile of a CCD reference image of the electron beam with no specimen present taken in the upper position of a TEM with selected operating parameter settings. FIG. 7 is a line profile of a CCD reference image of the same electron beam without a specimen present taken in the lower position of a TEM with the same selected operating settings. The y axis is labeled with relative intensities, the x axis is labeled with relative linear position across the image. The variation in illumination level profiles across the face of the CCD at the two CCD positions is readily apparent in FIGS. 6 and 7.

Figure 8A:
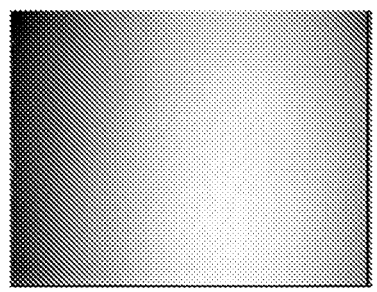
FIG. 8a. is an exemplary image of a raw electron beam with no sample.
Figure 8B:
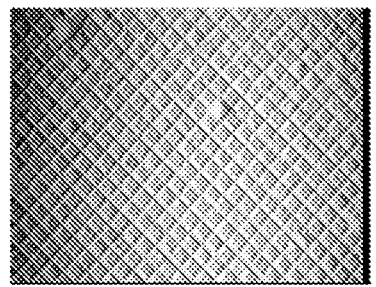
FIG. 8b. is an exemplary uncorrected image of a sample.
Figure 8C:
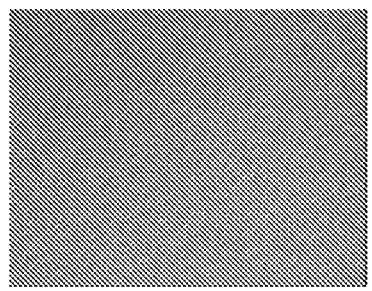
Figure 8D:
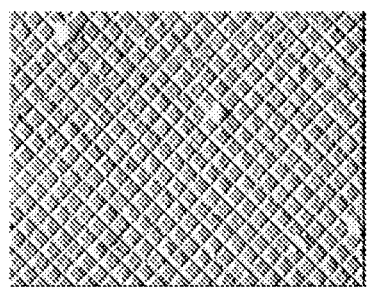
FIG. 8d. is an exemplary gain normalized image of the sample of FIG. 8b.

FIGS. 8a-8d. illustrate correction of image intensity variation for an actual sample. FIG. 8a is an uncorrected image of a raw electron beam with no sample present. FIG. 8b is an image made of a sample at the same magnification level as in FIG. 8a. Evident in FIG. 8b is the effect of unequal illumination intensity, with the left and right edges being darker than the center of the image, just as in FIG. 8a. FIG. 8c is a normalized image of the image of FIG. 8a. In a typical embodiment, an image such as 8a. is used as a reference image and some percentage of the image intensity level at each pixel is subtracted from subsequent images to normalize them. Using this process, an image such as shown in FIG. 8b, which has intensity artifacts can be normalized to produce an image such as is shown in FIG. 8d. By subtracting some percentage of each pixel's intensity level from the raw image in FIG. 8a from the sample image in FIG. 8b. the intensity artifacts seen in FIG. 8b are removed, as seen in FIG. 8d. Variation in intensity is not the only image artifact that can be corrected in this manner. Images containing information in addition to intensity, such as color images having hue and saturation values can also be corrected where necessary if image artifacts affect these values.

The foregoing discussion regarding evenness of illumination intensity serves mainly to illustrate the concept that variable settings on an imaging device can cause variable optical effects that cannot be compensated for by a single normalization image. While this description mainly discusses image artifacts resulting from changes in magnification settings, it is not intended to limit the scope of the invention to correcting only these kinds of image artifacts. Of course, other adverse image artifacts can result from variable system settings. For example, in an electron microscope, the electron acceleration voltage setting is a variable that may cause adverse image artifacts at different settings.

In an embodiment of a method to normalize images where system settings can cause variations in optical artifacts, multiple sets of reference images are collected and assigned corresponding to individual system settings or a range of settings. For example, in the case illustrated above, regarding the effect of TEM parameter changes on illumination evenness, reference images are taken at a plurality of TEM parameter settings such as magnification and/or accelerating voltage (kV). Gain reference images are then stored and prepared to account for illumination pattern changes under different magnification settings. As the user changes magnification settings, the correct gain reference assigned to that magnification and kV is used for image normalization. Where gain settings are infinitely adjustable, reference images can be assigned to a range of gain settings. The gain reference having an assigned range that includes the gain setting at which the subject image is taken is then selected to normalize the subject image.

In an embodiment of a normalization method, specific magnification ranges or magnification steps are assigned to a reference image set. For example, in the context of a TEM imaging system operating with digital micrograph generating software, the following procedure may be followed:

Depending on the TEM used, it may be that several successive magnification steps do not change the beam profile significantly. Most TEM's have at least three basic operating magnification ranges: low (1000×-10,000×), medium (11,000×40,000×) and high (50,000×-300,000×). To determine the effect of magnification changes on the gain reference images, one would start at the low gain end and collect a first set of gain reference images. Then an image of the beam is collected after increasing the magnification and the lowest gain normalization reference is used to correct the image. The increased magnification image is next examined for errors and, when an appreciable error is noted, the magnification value is recorded and a new gain reference set is collected for the recorded magnification value. In this manner, it can be seen for which magnification ranges on the TEM a new gain reference should be collected, and for which references a gain reference from an adjoining gain setting is sufficient.

Figure 9:
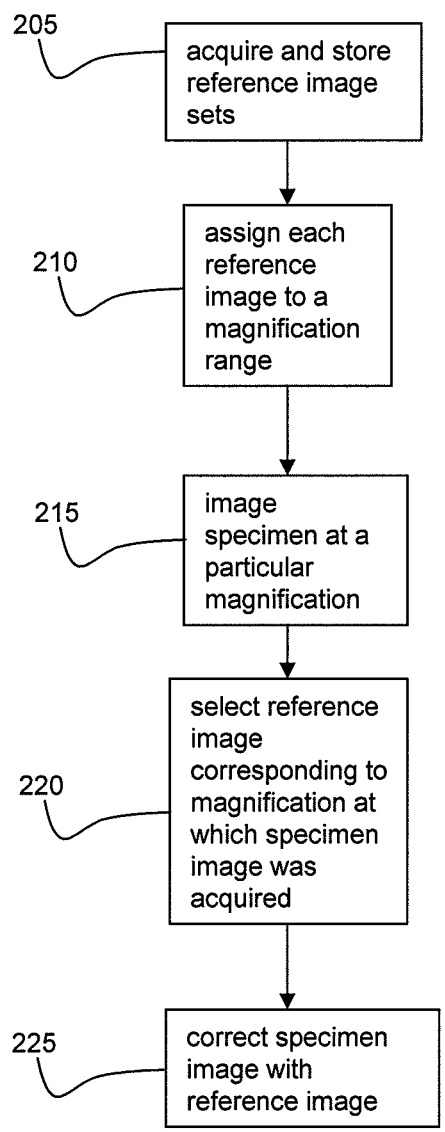
FIG. 9. is an exemplary process flow diagram for correcting an image with a reference image.

FIG. 9 is a flow diagram of an exemplary process for the acquisition of reference images and correction of specimen images with the reference images. At step 205 reference images are made at a number of magnification levels and stored. At step 210 each reference image is associated with a range of magnification levels. For example, one might assign a first reference image taken at a magnification level of 5000× to a range of 1000× to 10,000×. A second reference image taken at 20,000× would be assigned to a range of 11,000× to 40,000× and a third reference image taken at 100,000× would be assigned to a range of 50,000× to 300,000×. At step 215 an image of a specimen is taken at a particular magnification setting, for example at 30,000×. At step 220 the reference image is selected corresponding to the magnification range that included the magnification level at which the specimen image was made. At step 225, the specimen image is corrected with the reference image selected at step 225. One way to do this is to subtract some portion of the image intensity for each pixel of the reference image from the sample image, so that where the reference image is bright, the corrected sample image will be less bright and where the reference image is dark, the corrected sample image will not be altered, thus balancing out the image intensity of the sample image.

Figure 10:
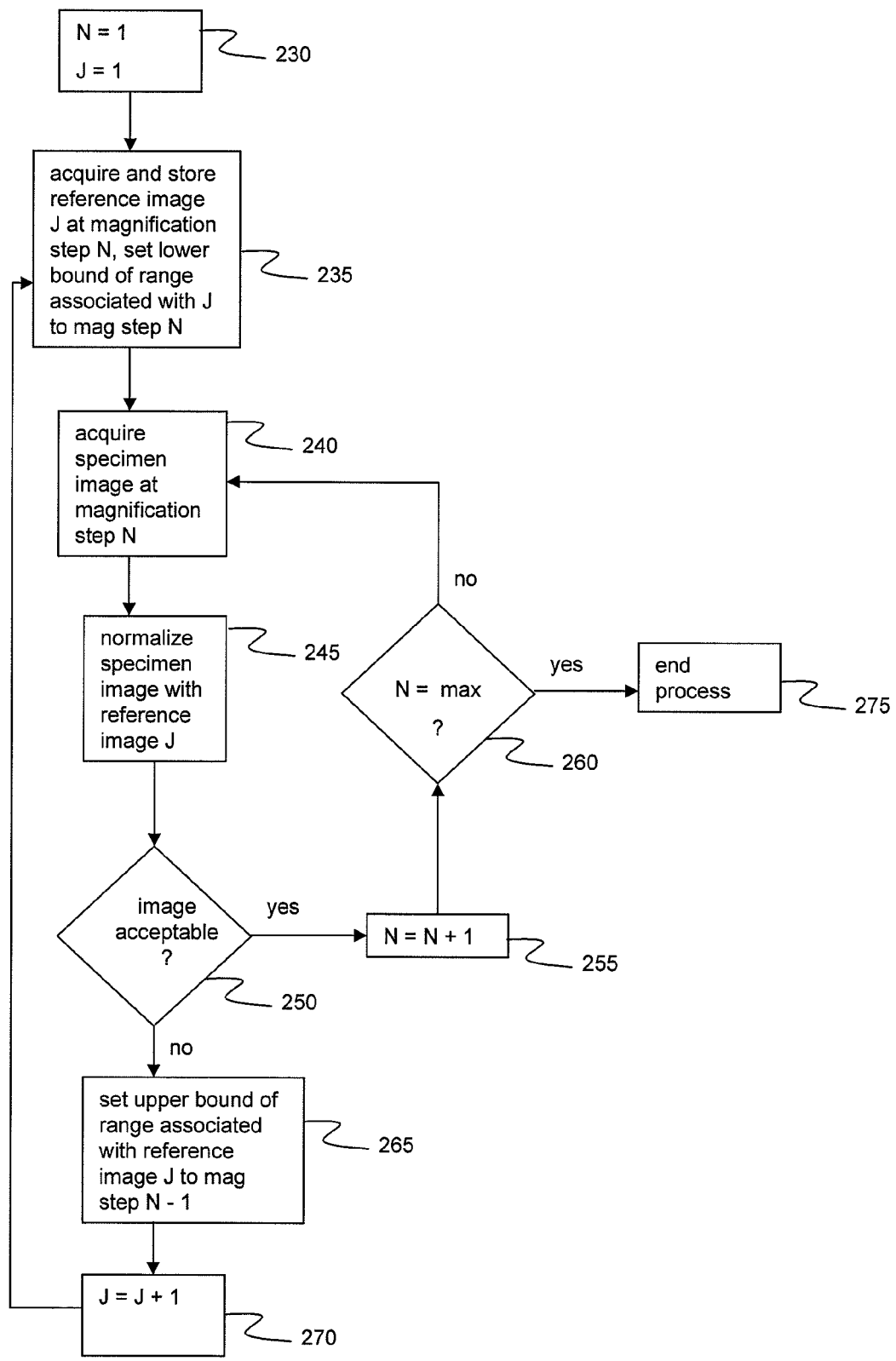
FIG. 10. is an exemplary process flow diagram for acquiring reference images and assigning them to appropriate magnification settings.

FIG. 10. is flow diagram of an exemplary process for acquiring reference images and assigning the images to magnification ranges as an example of one of the TEM parameters that could be used. A plurality of reference images is made and they are numbered. Variable J represents a number associated with each reference image. A series of magnification steps is assigned to the variable N. For example, for N=1 the magnification step represented is 1000×; N=2 represents magnification step 2500×; N=3 represents 5000×, and so on. Such an assignment can be represented in a tabular form for use in a computer program. At step 230, the variables N and J are set to 1, i.e., the lowest magnification step and the first reference image. At step 235, a reference image is taken at the magnification level associated with N=1 and the lower bound of the range of magnification levels associated with reference level J is assigned to the magnification level associated with N=1. At step 240, a specimen image is made at the magnification level associated with N=1. At step 245, the specimen image is normalized with the reference image represented by variable J. At decision point 250, it is determined whether the normalized image is acceptable or whether a new reference image at a higher magnification level is needed. In the first pass through steps 240-250, the normalized image should be acceptable, but in subsequent passes, when the specimen image is taken at increasing magnification levels, at some point the first reference image will not adequately correct the specimen image and a new reference image will be taken at a higher level. If the normalized image is acceptable at step 250, then N is incremented at step 255 to select the next magnification step. At decision point 260, N is tested to determine whether N has reached the number representing the highest magnification step. If N has reached the highest magnification step, the process of acquiring reference images is stopped at step 275. The loop including steps 240, 245 255 and decision points 250 and 260 is repeated for increasing magnification levels until a magnification level is reached for which the current reference image is not sufficient. At that point, the process flow goes to step 265 where the upper bound of magnification levels associated with the current reference image is set to the previous magnification level. In this manner a range of magnification levels is determined for a particular reference image. At step 270, the number of the reference image is incremented and at step 235, a new reference image J is taken. This reference image is then associated with a lower magnification bound that is equal to the current magnification step. In this manner, the process continues until the maximum magnification level is reached and process flow ends at step 275.

Once gain reference images are collected for the magnification ranges of interest, it should not be necessary to recollect gain reference images unless there has been some other significant change in the TEM optical parameters, such as illumination, condenser aperture size, objective aperture size, accelerating voltage and, in some cases, spot diameter size of the electron beam. For example, any alteration of the TEM system affecting overall illumination intensity delivered to the CCD camera by the TEM optics will have an effect on the gain reference images collected. It may be preferable to re-acquire dark reference images periodically as a maintenance check or as a part of troubleshooting because these images correct for components of the CCD and camera electronics and are independent of TEM beam illumination.

In an embodiment, collection of reference images and normalization of subject images with the reference images is automated with a computer. One area of concern is that reference images not overlap more than one system setting range. For example, a user might collect a reference image and assign it to one range of system settings (e.g. magnification of 4000× to 10,000×) and later collect a second reference image and assign it to a second range of system settings that includes some settings that were already accounted for by the first reference image (e.g. 8000× to 15000×). This creates an ambiguity that cannot be resolved when the system is set to acquire an image in the overlap range of 8000× to 10000×.

In order to prevent this from happening in an automated reference image collection software program, the software can track the assigned setting ranges when entered and prevent subsequent entry of a range that includes previously assigned setting ranges. In addition, as an aid to the user, the software can display a list of previously assigned magnification ranges at the time that new reference images are being assigned to setting ranges.

Without further elaboration, the foregoing will so fully illustrate this invention that others may, by applying current or future knowledge, readily adopt the same for use under various conditions of service.

We claim:

1. A method for correcting an image made from a system having optical flaws and a plurality of system parameter settings wherein the system produces image artifacts that result from the optical flaws and that vary according to the settings, the method comprising the steps of:

acquiring a first reference image, having first artifacts caused by the optical flaws, with the system at a first system parameter setting;

associating said first reference image with a first range of system parameter settings, said first range including said first system parameter setting;

storing said first reference image;

acquiring a second reference image, having second artifacts caused by the optical flaws, with the system at a second system parameter setting;

associating said second reference image with a second range of system parameter settings, said second range including said second system parameter setting and being exclusive of said first range of system parameter settings;

storing said second reference image;

correcting a subject image having third artifacts caused by the optical flaws and acquired by the system at a third system parameter setting by using said first reference image if said third system parameter setting falls in said first range of system parameter settings and using said second reference image, if said third system parameter setting falls in said second range of system parameter settings, wherein said first, second and third system parameter settings refer to the same system parameter and the system parameter is any one of the group consisting of accelerating voltage, magnification, probe size and beam intensity.

2. The method of claim 1, wherein the system is an electron microscope and wherein at least one of the image artifacts is uneven illumination of an image recording device.

3. The method of claim 2, wherein said image recording device is one of the group consisting of: a charge coupled device, a photomultiplier tube and a photosensitized film.

4. The method of claim 1, wherein said system also produces image artifacts that do not vary according to the settings.

5. The method of claim 1, wherein at least one of the image artifacts varies based on magnification level.

6. The method of claim 1, wherein said system is a particle beam microscope and wherein at least one of the image artifacts varies based on particle energy level.

7. The method of claim 1, wherein said first and second reference images are made of a uniform subject.

8. The method of claim 1, wherein said first and second reference images are raw electron beam images.

9. The method of claim 1, wherein said first and second reference images and said subject image are digital images comprised of pixels having intensity values and wherein said correcting of said subject image comprises subtracting at least a fraction of said pixel intensity values of one of said reference images from said pixel intensity values of said subject image.

* * * * *